United States Patent [19]

Komabayashi et al.

[11] Patent Number: 5,057,161
[45] Date of Patent: Oct. 15, 1991

[54] P-TYPE FE SILICIDE THERMOELECTRIC CONVERSION MATERIAL

[75] Inventors: Masashi Komabayashi; Kenichi Hijikata, both of Ohmiya, Japan

[73] Assignee: Mitsubishi Materials Corporation, Tokyo, Japan

[21] Appl. No.: 563,291

[22] Filed: Aug. 6, 1990

[30] Foreign Application Priority Data

Aug. 15, 1989 [JP] Japan .................................. 1-210273

[51] Int. Cl.$^5$ ............................................. H01L 35/20
[52] U.S. Cl. .................................. 136/240; 136/236.1; 136/239
[58] Field of Search ........................ 136/236.1, 239, 240

[56] References Cited

U.S. PATENT DOCUMENTS

| | | | |
|---|---|---|---|
| 3,582,324 | 6/1971 | Kunert et al. | 75/134 |
| 4,173,687 | 11/1979 | McKaveney et al. | 429/218 |
| 4,500,741 | 2/1985 | Morimoto et al. | 136/206 |
| 4,589,918 | 5/1986 | Nishida et al. | 75/244 |

FOREIGN PATENT DOCUMENTS 60-43881  3/1985  Japan.
1118184  6/1968  United Kingdom ............... 136/239

*Primary Examiner*—Brooks H. Hunt
*Assistant Examiner*—Chrisman D. Carroll
*Attorney, Agent, or Firm*—Frishauf, Holtz, Goodman & Woodward

[57] ABSTRACT

A p-type Fe silicide thermoelectric conversion material comprises an Fe silicide, wherein at least one of Cr and V is substituted for part of Fe in the Fe silicide. The Fe silicide is chemically expressed as $Fe_{1-x}M_xSi_2$, wherein the value of x falls within a range of 0.01 to 0.1, and M represents the at least one of Cr and V. Alternatively, at least one of Cr and V, and Mn are substituted for part of Fe in the Fe silicide. In this case, the Fe silicide is chemically expressed as $Fe_{1-x}(M+Mn)_xSi_2$, wherein the value of x falls within a range of 0.01 to 0.1, where M represents the at least one of Cr and V.

18 Claims, No Drawings

P-TYPE FE SILICIDE THERMOELECTRIC CONVERSION MATERIAL

BACKGROUND OF THE INVENTION

1. Field of the Invention

This invention relates to a p-type Fe silicide thermoelectric conversion material for thermoelectric conversion devices, and more particularly to a material of this kind which is adapted for use in thermoelectric conversion devices for effecting thermoelectric power generation, thermoelectric cooling and heating, as well as for various sensing purposes.

2. Background Information

In general, a p-type thermoelectric conversion material, mating with an n-type thermoelectric conversion material, is used in thermoelectric conversion devices for thermoelectric power generation wherein thermal energy is directly converted into electric energy, ones for thermoelectric cooling or heating wherein cooling or heating is effected by causing electric current to flow therethrough, or other thermoelectric sensing devices.

Conventionally known p-type Fe silicide materials for thermoelectric conversion devices include one formed of a pure Fe silicide ("FeSi$_2$"), one proposed e.g. by Japanese Provisional Patent Publication (Kokai) No. 60-43881, which is formed of an Fe silicide in which Mn and Al are partly substituted respectively for part of Fe and part of Si (hereinafter called "the Mn-Al substitution type"), and one formed of an Fe silicide part of which is formed of a metallic phase (hereinafter called "the metallic phase type").

P-type thermoelectric conversion materials of this kind are generally required to have a large Seebeck coefficient S ($\mu$V/° C.) for obtaining an adequate thermoelectromotive force or satisfactory thermoelectric cooling effect, a small specific resistance $\rho$ for reducing generation of Joule heat, and a small thermal conductivity K for obtaining an adequate temperature difference across the material.

The maximum output Pmax of a p-type thermoelectric conversion material which is employed as a thermoelectric power generation element can be expressed by the following equation:

$$P_{max} = \frac{1}{4} \cdot \frac{S^2 \Delta T^2}{\rho}$$

where S is the Seebeck coefficient, $\rho$ the specific resistance, and $\Delta$T the difference in temperature between two predetermined points of the p-type material. It is clear from the above equation that the maximum output Pmax of the p-type thermoelectric conversion material increases with an increase in an output factor represented by $S^2/\rho$ in the same equation.

The pure FeSi$_2$ has a large Seebeck coefficient S, but it has a large specific resistance $\rho$, i.e. several $\Omega$/cm so that it is too small in the maximum output Pmax to be practically used as a thermoelectric power generation element.

The metallic phase type has a small specific resistance $\rho$, but the Seebeck coefficient S is as small as several $\mu$V/° C. As a consequence, the metallic phase type also has an insufficient maximum output Pmax and hence fails to exhibit improved thermoelectric power generation properties over the pure FeSi$_2$.

On the other hand, the Mn-Al substitution type has a satisfactory Seebeck coefficient S, i.e. 150 to 350 $\mu$V/° C., and specific resistance $\rho$ of 5 to 10 m$\Omega$/cm, and can therefore form an excellent thermoelectric conversion element. However, the specific resistance $\rho$ of 5 to 10 m$\Omega$/cm is still large for the material to be used as a thermoelectric power generation element because the output factor $S^2/\rho$ is small and accordingly the maximum output pmax is insufficient.

SUMMARY OF THE INVENTION

It is therefore the object of the invention to provide a p-type Fe silicide thermoelectric conversion material which has increased maximum output and hence can exhibit excellent power generation ability, when used as a thermoelectric power generation element.

To attain the above object, the present invention provides a p-type Fe silicide thermoelectric conversion material comprising an Fe silicide.

The p-type Fe silicide thermoelectric conversion material according to the present invention is characterized by an improvement wherein at least one of Cr and V is substituted for part of Fe in the Fe silicide.

The Fe silicide is chemically expressed as Fe$_{1-x}$M$_x$Si$_2$, wherein the value of x falls within a range of 0.01 to 0.1, and M represents the at least one of Cr and V.

Alternatively, at least one of Cr and V, and Mn may be substituted for part of Fe in the Fe silicide. In this case, the Fe silicide is chemically expressed as Fe$_{1-x}$((M+Mn)$_x$Si$_2$, wherein the value of x falls within a range of 0.01 to 0.1, and M represents the at least one of Cr and V.

The above and other objects, features and advantages of the invention will be more apparent from the ensuing detailed description.

DETAILED DESCRIPTION

Under the above stated circumstances, the present inventors have made studies in order to obtain a p-type Fe silicide thermoelectric conversion material, which generates adequate maximum output, and reached the following finding:

If at least one of Cr and V (hereinafter referred to as "M") is substituted for part of Fe in FeSi$_2$, or if M and manganese (Mn) is substituted for part of Fe in FeSi$_2$, the obtained p-type Fe silicide material is by far superior in maximum output to any of the aforementioned known p-type Fe silicide thermoelectric conversion materials, when used in a thermoelectric conversion device.

The present invention is based upon the above finding.

A p-type Fe silicide thermoelectric conversion material according to the invention comprises an Fe silicide, wherein at least one of Cr and V is substituted for part of Fe in the Fe silicide. The Fe silicide is chemically expressed as Fe$_{1-x}$M$_x$Si$_2$, wherein the value of x falls within a range of 0.01 to 0.1, and M represents the at least one of Cr and V.

Alternatively, the p-type Fe silicide thermoelectric conversion material according to the invention may comprise an Fe silicide, wherein at least one of Cr and V, and Mn are substituted for part of Fe in the Fe silicide. The Fe silicide is chemically expressed as Fe$_{1-x}$(M+Mn)$_x$Si$_2$ wherein the value of x falls within a range of 0.01 to 0.1, and M represents the at least one of Cr and V.

The reason for limiting the value x in the above equations to a range of 0.01 to 0.1 is explained below: If the value of x is smaller than 0.01, the resulting Fe silicide material fails to provide sufficient maximum output Pmax. On the other hand, if the amount of Fe substitution is large such that x is in excess of 0.1, the resulting Fe silicide material has a decreased Seebeck coefficient S. Since in either case the thermoelectric conversion characteristic is degraded, the value of x has been limited within a range of 1.01 to 0.1, preferably 0.05 to 0.08.

The p-type Fe silicide thermoelectric conversion material according to the invention can be manufactured by a conventional method.

For example, if the p-type Fe silicide thermoelectric conversion material is to be obtained in the form of a bulk by a powder metallurgical method, Fe, Si and an additive M as starting materials, and an additive Mn if required, are first blended so as to obtain a desired predetermined chemical composition, and the blended materials are melted and pulverized into a powder. The powder is then compacted and sintered or hot pressed into a sintered body.

If the p-type Fe silicide thermoelectric conversion material is to be used in the form of a thin film, an amorphous film is formed on a substrate formed of glass by means of a magnetron sputtering method using a target formed of a material having a desired predetermined chemical composition. The amorphous thin film is annealed at a temperature of 550° to 650° C., into a crystalline Fe silicide film.

The Fe silicides thus obtained both two show values of Seebeck coefficient S of approximately +400 $\mu V/°$ C. and values of specific resistance $\rho$ of approximately 2 $m\Omega/cm$. That is, they show values of Seebeck coefficient S about 1.5 times as high as that of the conventional p-type Fe silicide in which Mn and Al are substituted respectively for part of Fe and part of Si, and values of specific resistances about one third as high as that of the same conventional Fe silicide. Therefore, the Fe silicide thermoelectric conversion materials according to the invention have satisfactorily large values of output factor $S^2/\rho$, which assure sufficient maximum output Pmax, thus being by far superior to the conventional Fe silicide in respect of thermoelectric conversion properties.

Examples of the invention will be explained hereinbelow.

EXAMPLE 1

Starting materials of Fe, Si, Cr, V, and Mn were prepared, and blended so as to have predetermined chemical compositions. The blended melting materials were charged into a crucible formed of alumina, where they were melted under vacuum at a temperature of 1250° C. into ingots having respective different chemical compositions. The ingots were each crushed by the use of a jaw crusher, and then pulverized by an iron-made ball mill for 8 hours into a fine powder having a mean particle size of 4 $\mu m$. The obtained fine powders were hot pressed at a temperature of 1000° C. under a pressure of 150 $kg/cm^2$, to obtain sintered bodies Nos. 1-9 according to the present invention, comparative sintered bodies Nos. 1-4, and a conventional sintered body, having respective chemical compositions shown in Table 1. These sintered bodies were measured in respect of specific resistance $\rho$ ($m\Omega/cm$) at room temperature and Seebeck coefficient S ($\mu V/°$ C.), followed by calculating the output factor $S^2/\rho$ from the measured values. The results of the measurements together with the calculated $S^2/\rho$ values are shown in Table 1.

EXAMPLE 2

The same powders having respective different chemical compositions as those obtained in Example 1 were hot pressed under exactly the same conditions as those in Example 1, to obtain targets having respective different chemical compositions shown in Table 2 which are exactly identical with those of the sintered bodies obtained in Example 1, respectively, each being in the form of a disc having a diameter of 125 mm and a thickness of 5 mm.

By the use of these disc-shaped targets, amorphous thin films each having a thickness of 1.2 $\mu m$ were formed on substrata formed of glass by means of RF magnetron sputtering. The amorphous thin films were annealed under an Ar gas atmosphere at a temperature of 650° C. and for 30 minutes, to be crystallized into crystalline films Nos. 10-18 according to the present invention, comparative crystalline films Nos. 5-8, and a conventional crystalline thin film.

TABLE 1

| CHEMICAL COMPOSITION [$Fe_{1-x}M_x Si_2$ OR $Fe_{1-x}(M + Mn)_x Si_2$] | SEEBECK COEFFICIENT S ($\mu V/deg$) | SPECIFIC RESISTANCE $\rho$ ($m\Omega \cdot cm$) | OUTPUT FACTOR $S^2/\rho$ ($mW/m \cdot K^2$) |
|---|---|---|---|
| SINTERED BODIES ACCORDING TO THE PRESENT INVENTION | | | |
| 1  $Fe_{0.99}V_{0.01}Si_2$ | 405 | 3.9 | 4.2 |
| 2  $Fe_{0.96}V_{0.04}Si_2$ | 370 | 3.1 | 4.4 |
| 3  $Fe_{0.91}V_{0.09}Si_2$ | 236 | 2.8 | 2.0 |
| 4  $Fe_{0.98}Cr_{0.02}Si_2$ | 387 | 3.7 | 4.0 |
| 5  $Fe_{0.95}Cr_{0.05}Si_2$ | 261 | 2.9 | 2.3 |
| 6  $Fe_{0.90}Cr_{0.10}Si_2$ | 233 | 2.3 | 2.4 |
| 7  $Fe_{0.95}Cr_{0.03}V_{0.02}Si_2$ | 325 | 3.6 | 2.9 |
| 8  $Fe_{0.90}Cr_{0.03}V_{0.07}Si_2$ | 218 | 2.5 | 1.9 |
| 9  $Fe_{0.90}Cr_{0.07}V_{0.02}Mn_{0.01}Si_2$ | 207 | 2.2 | 1.9 |
| COMPARATIVE SINTERED BODIES | | | |
| 1  $Fe_{0.995}V_{0.005}·Si_2$ | 421 | 11.0 | 1.6 |
| 2  $Fe_{0.85}V_{0.15}·Si_2$ | 176 | 2.1 | 1.5 |
| 3  $Fe_{0.995}Cr_{0.005}·Si_2$ | 453 | 13.1 | 1.6 |
| 4  $Fe_{0.85}Cr_{0.15}·Si_2$ | 187 | 2.1 | 1.7 |
| CONVENTIONAL SINTERED BODY | | | |

TABLE 1-continued

| CHEMICAL COMPOSITION $[Fe_{1-x}M_x Si_2$ OR $Fe_{1-x}(M + Mn)_x Si_2]$ | SEEBECK COEFFICIENT S ($\mu$V/deg) | SPECIFIC RESISTANCE $\rho$ (m$\Omega \cdot$ cm) | OUTPUT FACTOR $S^2/\rho$ (mW/m $\cdot$ K$^2$) |
|---|---|---|---|
| $Fe_{0.98}Mn_{0.02}Si_{1.94}Al_{0.06}$ | 290 | 4.9 | 1.7 |

(*ASTERISKED VALUES FALL OUTSIDE RANGE OF PRESENT INVENTION)

The obtained crystalline thin films were each analyzed to determine chemical compositions thereof by the use of an X-ray microanalyzer, the results of which are shown in Table 2. Further, the specific resistance $\rho$ (m$\Omega$/cm) and Seebeck coefficient S ($\mu$V/° C.) of the crystalline films were measured, followed by calculating factor $S^2/\rho$ from the measured values. The results of the measurements and calculation are shown in Table 2.

It will be learned from Tables 1 and 2 that the sintered bodies Nos. 1-9 and the crystalline films Nos. 10-18 according to the present invention, in which M+Mn are substituted for part of Fe, each have a larger output factor $S^2/\rho$ than those of the conventional sintered body and the conventional crystalline film.

Therefore, it is clear that the sintered bodies Nos. 1-9 and the crystalline films Nos. 10-18 according to the present invention will show higher maximum output Pmax than the conventional sintered body and the conventional crystalline film when they are used as thermoelectric power generation elements.

Further, it will be understood from Tables 1 and 2 that the sintered bodies Nos. 1-9 and the crystalline films Nos. 10-18 according to the present invention, which each have a chemical composition of $Fe_{1-x}M_x Si_2$ or $Fe_{1-x}(M+Mn)_x Si_2$, where the value of x falls within a range of 0.01 to 0.1 according to the present invention, all show satisfactorily increased values of the output factor $S^2/\rho$. On the other hand, the comparative sintered bodies Nos. 1-4 and the comparative crystalline films Nos. 5-8, in which x falls outside the range of 0.01 to 0.1 (in Tables 1 and 2 the asterisked substitution amounts x fall outside the range of the present invention), show much lower values of output factor $S^2/\rho$, which means that they are unable to generate sufficient maximum output Pmax, when used as thermoelectric power generation elements, thus being by far inferior in thermoelectric conversion properties to the p-type Fe silicide material according to the present invention.

TABLE 2

| DISC-SHAPED TARGET CHEMICAL COMPOSITION $[Fe_{1-x}(M \text{ OR } M + Mn)_x Si_2]$ | CRYSTALLINE THIN FILM CHEMICAL COMPOSITION $[Fe_{1-x}(M \text{ OR } M + Mn)_x Si_y,$ PROVIDED $y \approx 2]$ | SEEBECK COEFFICIENT S ($\mu$V/°C.) | SPECIFIC RESISTANCE $\rho$ (m$\Omega \cdot$ cm) | OUTPUT FACTOR $S^2/\rho$ (mW/m $\cdot$ K$^2$) |
|---|---|---|---|---|
| CRYSTALLINE THIN FILMS ACCORDING TO THE PRESENT INVENTION | | | | |
| 10 $Fe_{0.99}V_{0.01}Si_2$ | $Fe_{0.99}V_{0.01}Si_{2.05}$ | 393 | 4.3 | 3.6 |
| 11 $Fe_{0.96}V_{0.04}Si_2$ | $Fe_{0.96}V_{0.04}Si_{2.01}$ | 362 | 3.3 | 4.0 |
| 12 $Fe_{0.91}V_{0.09}Si_2$ | $Fe_{0.91}V_{0.09}Si_{2.03}$ | 218 | 2.6 | 1.8 |
| 13 $Fe_{0.98}Cr_{0.02}Si_2$ | $Fe_{0.98}Cr_{0.02}Si_{2.04}$ | 369 | 4.2 | 3.2 |
| 14 $Fe_{0.95}Cr_{0.05}Si_2$ | $Fe_{0.95}Cr_{0.05}Si_{1.98}$ | 251 | 3.1 | 2.0 |
| 15 $Fe_{0.90}Cr_{0.10}Si_2$ | $Fe_{0.90}Cr_{0.10}Si_{1.96}$ | 225 | 2.4 | 2.1 |
| 16 $Fe_{0.95}Cr_{0.03}V_{0.02}Si_2$ | $Fe_{0.95}Cr_{0.03}V_{0.02}Si_{2.04}$ | 308 | 3.7 | 2.6 |
| 17 $Fe_{0.90}Cr_{0.03}V_{0.07}Si_2$ | $Fe_{0.90}Cr_{0.03}V_{0.07}Si_{1.99}$ | 211 | 2.5 | 1.8 |
| 18 $Fe_{0.90}Cr_{0.07}V_{0.02}Mn_{0.01}Si_2$ | $Fe_{0.90}Cr_{0.07}V_{0.02}Mn_{0.01}Si_{1.95}$ | 203 | 2.4 | 1.7 |
| COMPARATIVE CRYSTALLINE THIN FILMS | | | | |
| 5 $Fe_{0.995}V_{0.005}^*Si_2$ | $Fe_{0.995}V_{0.005}^*Si_{2.02}$ | 413 | 12.1 | 1.4 |
| 6 $Fe_{0.85}V_{0.15}^*Si_2$ | $Fe_{0.85}V_{0.15}^*Si_{2.01}$ | 169 | 2.2 | 1.3 |
| 7 $Fe_{0.995}Cr_{0.005}^*Si_2$ | $Fe_{0.95}Cr_{0.005}^*Si_{1.98}$ | 404 | 13.6 | 1.2 |
| 8 $Fe_{0.85}Cr_{0.15}^*Si_2$ | $Fe_{0.85}Cr_{0.15}^*Si_{1.96}$ | 171 | 2.0 | 1.5 |
| CONVENTIONAL CRYSTALLINE THIN FILM | | | | |
| $Fe_{0.98}Mn_{0.02}Si_{1.94}Al_{0.06}$ | $Fe_{0.98}Mn_{0.02}Si_{1.98}Al_{0.06}$ | 210 | 3.0 | 1.5 |

(*ASTERISKED VALUES FALL OUTSIDE RANGE OF PRESENT INVENTION)

What is claimed is:

1. A p-type Fe silicide thermoelectric conversion material comprising an Fe silicide,
    wherein V is substituted for part of Fe in said Fe silicide.

2. The p-type Fe silicide thermoelectric conversion material as claimed in claim 1, wherein said Fe silicide is chemically expressed as $Fe_{1-x}M_xSi_2$, x being 0.01 to 0.1, where M represents V.

3. The p-type Fe silicide thermoelectric conversion material as claimed in claim 2, wherein x is 0.05 to 0.08.

4. A p-type Fe silicide thermoelectric conversion material comprising an Fe silicide,
    wherein V and Mn are substituted for part of Fe in said Fe silicide.

5. The p-type Fe silicide thermoelectric conversion material as claimed in claim 4, wherein said Fe silicide is chemically expressed as $Fe_{1-x}(M+Mn)_xSi_2$, x being 0.01 to 0.1, where M represents V.

6. The p-type Fe silicide thermoelectric conversion material as claimed in claim 5, wherein x is 0.05 to 0.08.

7. A p-type Fe silicide thermoelectric conversion material comprising an Fe silicide, wherein V and Cr are substituted in part for Fe in said Fe silicide.

8. The p-type Fe silicide thermoelectric conversion material as claimed in claim 7, wherein said Fe silicide is chemically expressed as $Fe_{1-x}(V+Cr)_xSi_2$, wherein x is 0.01 to 0.1.

9. The p-type Fe silicide thermoelectric conversion material as claimed in claim 8, wherein x is 0.05 to 0.08.

10. A p-type Fe silicide thermoelectric conversion material comprising an Fe silicide, wherein V, Mn and Cr are substituted in part for Fe in said Fe silicide.

11. The p-type Fe silicide thermoelectric conversion material as claimed in claim 10, wherein said Fe silicide is chemically expressed as $Fe_{1-x}(V+Cr+Mn)_xSi_2$, wherein x is 0.01 to 0.1.

12. The p-type Fe silicide thermoelectric conversion material as claimed in claim 11, wherein x is 0.05 to 0.08.

13. The p-type Fe silicide thermoelectric conversion material as claimed in claim 1, wherein said Fe silicide is $Fe_{0.99}V_{0.01}Si_2$.

14. The p-type Fe silicide thermoelectric conversion material as claimed in claim 1, wherein the Fe silicide is $Fe_{0.96}V_{0.04}Si_2$.

15. The p-type Fe silicide thermoelectric conversion material as claimed in claim 1, wherein the Fe silicide is $Fe_{0.91}V_{0.09}Si_2$.

16. The p-type Fe silicide thermoelectric conversion material as claimed in claim 7, wherein said Fe silicide is $Fe_{0.95}Cr_{0.03}V_{0.02}Si_2$.

17. The p-type Fe silicide thermoelectric conversion material as claimed in claim 7, wherein said Fe silicide is $Fe_{0.90}Cr_{0.03}V_{0.07}Si_2$.

18. The p-type Fe silicide thermoelectric conversion material as claimed in claim 10, wherein said Fe silicide is $Fe_{0.90}Cr_{0.07}Mn_{0.01}Si_2$.

* * * * *